(12) United States Patent
Shin et al.

(10) Patent No.: US 7,999,582 B2
(45) Date of Patent: Aug. 16, 2011

(54) APPARATUS FOR SUPPLYING VOLTAGE FREE FROM NOISE AND METHOD OF OPERATION THE SAME

(75) Inventors: Yoon-Jae Shin, Gyeonggi-do (KR); Jun-Gi Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 574 days.

(21) Appl. No.: 11/647,486

(22) Filed: Dec. 29, 2006

(65) Prior Publication Data

US 2007/0285142 A1 Dec. 13, 2007

(30) Foreign Application Priority Data

Jun. 9, 2006 (KR) ........................ 10-2006-0051772

(51) Int. Cl.
*H03L 7/00* (2006.01)
(52) U.S. Cl. ......... 327/143; 327/208; 327/236; 327/540
(58) Field of Classification Search .................... 327/41, 327/46, 51, 143, 208, 236, 244, 540, 541
See application file for complete search history.

(56) References Cited

U.S. PATENT DOCUMENTS

| | | | | |
|---|---|---|---|---|
| 5,237,213 A * | 8/1993 | Tanoi | | 327/205 |
| 5,560,023 A | 9/1996 | Crump et al. | | |
| 5,629,642 A * | 5/1997 | Yoshimura | | 327/142 |
| 6,097,226 A | 8/2000 | Kim | | |
| 6,320,470 B1* | 11/2001 | Arai et al. | | 331/17 |
| 6,798,250 B1* | 9/2004 | Wile | | 327/51 |
| 6,928,014 B2 | 8/2005 | Jeong | | |
| 6,933,765 B2* | 8/2005 | Kanno et al. | | 327/333 |
| 7,068,558 B2* | 6/2006 | Cho | | 365/222 |
| 7,107,467 B2 | 9/2006 | Lee et al. | | |
| 7,157,947 B2* | 1/2007 | Chansungsan et al. | | 327/143 |
| 2002/0000970 A1* | 1/2002 | Akimoto et al. | | 345/100 |
| 2005/0122138 A1 | 6/2005 | Chansungsan et al. | | |
| 2005/0146964 A1* | 7/2005 | Sako | | 365/211 |
| 2006/0033559 A1* | 2/2006 | Yuuki et al. | | 327/545 |
| 2006/0091550 A1 | 5/2006 | Shimazaki et al. | | |
| 2006/0221531 A1 | 10/2006 | Nagata | | |
| 2007/0057678 A1* | 3/2007 | Dvorak et al. | | 324/536 |

FOREIGN PATENT DOCUMENTS

| | | |
|---|---|---|
| JP | 2000-357949 | 12/2000 |
| JP | 2002-222919 | 8/2002 |
| JP | 2005-157801 A | 6/2005 |
| JP | 2006-12403 | 1/2006 |
| KR | 10-1998-0074778 | 11/1998 |
| KR | 1020010004222 | 1/2001 |
| KR | 1020010061480 | 7/2001 |
| KR | 1020030001856 | 1/2003 |
| TW | 427064 | 3/2001 |

* cited by examiner

*Primary Examiner* — Douglas W Owens
*Assistant Examiner* — Tung X Le
(74) *Attorney, Agent, or Firm* — Venable LLP; Jeffri A. Kaminski

(57) ABSTRACT

A voltage supply apparatus includes a power noise sensing unit, a voltage selecting unit, a first power voltage supply unit and a second power voltage supply unit. The power noise sensing unit senses noise from first and second powers and outputs a power noise sensing signal. The voltage selecting unit outputs first and second driving signals in response to a voltage-supply-enable-signal and the power noise sensing signal. The first power voltage supply unit applies a voltage of the first power in response to the first and second driving signals. The second power voltage supply unit applies a voltage of the second power in response to the first and second driving signals.

21 Claims, 5 Drawing Sheets

APPARATUS FOR SUPPLYING VOLTAGE FREE FROM NOISE AND METHOD OF OPERATION THE SAME

BACKGROUND OF THE INVENTION

1. Technical Field

The present invention relates to a voltage supply apparatus and method and, in particular, to a voltage supply apparatus and method for supplying a voltage to an operation circuit of a semiconductor memory apparatus.

2. Related Art

In general, as semiconductor memories become highly integrated, each element of a memory circuit has become smaller. A CPU (Central Processing Unit) used in a system having a semiconductor memory is designed to operate at a high frequency. Thus the semiconductor memory is also designed to operate at a high frequency.

In order to design a memory that operates at a high frequency, the power voltage of the semiconductor memory needs to be low. However, as the power voltage becomes low, noise may cause critical problems.

Currently, in a semiconductor memory apparatus, a plurality of power voltages applied from the outside at the same level is used. Further, a plurality of voltages generated within a chip from the power voltages is used and pads thereof are separated.

FIG. 1 is a circuit diagram showing a conventional voltage supplying apparatus.

The conventional voltage supplying apparatus includes: a first inverter IV1, a second inverter IV2, a PMOS transistor P1 and a NMOS transistor N1.

The first inverter IV1 receives a voltage supply enable signal EN_SIG, inverts the received voltage supply enable signal EN_SIG, and outputs the inverted voltage supply enable signal as an output signal EN_SIGb.

The second inverter IV2 inverts an output signal EN_SIGb of the first inverter IV1 and outputs the inverted output signal as an output signal EN_SIG.

The PMOS transistor P1 has a gate terminal that receives the output signal EN_SIGb of the first inverter IV1, a source terminal to which a power voltage VDDA or VDDB is applied, and a drain terminal that is connected to an operation circuit 10.

The NMOS transistor N1 has a gate terminal that receives the output signal EN_SIG of the second inverter IV2, a source terminal to which a ground voltage VSSA or VSSB is applied, and a drain terminal that is connected to the operation circuit 10.

The operation circuit 10 is a general circuit which receives the power voltage VDDA or VDDB or the ground voltage VSSA or VSSB and which outputs the output signal OUTPUT_ORG.

Here, the operation circuit 10 receives a first power voltage VDDA and a first ground voltage VSSA or receives a second power voltage VDDB and a second ground voltage VSSB.

As shown in FIG. 1, the conventional voltage supply apparatus is designed such that only a fixed power voltage is supplied in response to the voltage supply enable signal EN_SIG, which activates the voltage supply apparatus.

However, no circuit senses an amount of noise in the voltages applied to the memory, even when each power supply applied to the memory has a different amount of noise. That is, even when the amount of noise generated in the first power voltage VDDA and the first ground voltage VSSA is greater than the amount of noise generated in the second power voltage VDDB and the second ground voltage VSSB, the first power voltage VDDA and the first ground voltage VSSA are used.

As described above, since the conventional voltage supply apparatus cannot sense power noise, there is a problem in that the semiconductor memory may function erroneously due to the noise, thereby reducing the performance of the semiconductor memory.

SUMMARY OF THE INVENTION

Embodiments of the present invention provide an apparatus for supplying voltages free from noise and a method of operation the same. An amount of noise in a power supply applied to the internal circuits of a semiconductor memory apparatus is sensed and a power supply having less noise is used. Consequently, the internal circuits of the semiconductor memory apparatus can operate stably.

According to a first embodiment of the present invention, a voltage supply apparatus may include: a power noise sensing unit, a voltage selecting unit, a first power voltage supply unit and a second power voltage supply unit.

The power noise sensing unit may sense the noise from first and second power supplies and outputs a power noise sensing signal.

The voltage selecting unit may output first and second driving signals in response to a voltage-supply-enable-signal and the power noise sensing signal.

The first power voltage supply unit may supply a voltage of the first power supply in response to the first and second driving signals.

The second power voltage supply unit may supply a voltage of the second power supply in response to the first and second driving signals.

The voltage supply apparatus may further include an operation circuit.

The operation circuit may receive the voltage of the first supply or second power supply, may execute a predetermined operation, and may output an output signal.

According to a second embodiment of the present invention, a voltage supply apparatus may include: a power noise sensing unit and a power voltage supply unit.

The power noise sensing unit may sense noise of a first power supply and a second power supply and may output a power noise sensing signal.

The power voltage supply unit selectively may supply a voltage of the first power supply or the second power supply in response to the power noise sensing signal.

According to the second embodiment of the present invention, the voltage supply apparatus may further include an operation circuit.

The operation circuit may receive the voltage of the first supply or second power supply, may execute a predetermined operation, and may output an output signal.

According to a third embodiment of the present invention, a voltage supply method may include: outputting a power noise sensing signal by sensing the noises of first and second powers supplies; outputting first and second driving signals in response to a voltage-supply-enable-signal and the power noise sensing signal; and applying a voltage of the first power supply or the second power supply to an operation circuit in response to the first and second driving signals.

According to a fourth another embodiment of the present invention, a voltage supply method may include: outputting a power noise sensing signal by sensing the noises of first and second power supplies; and selectively applying a voltage of the first power supply or a voltage of the second power supply to an operation circuit in response to the power noise sensing signal.

DESCRIPTION OF EXEMPLARY EMBODIMENT

Hereinafter, an embodiment of the present invention will be described in detail with reference to the accompanying drawings.

Figure 1:
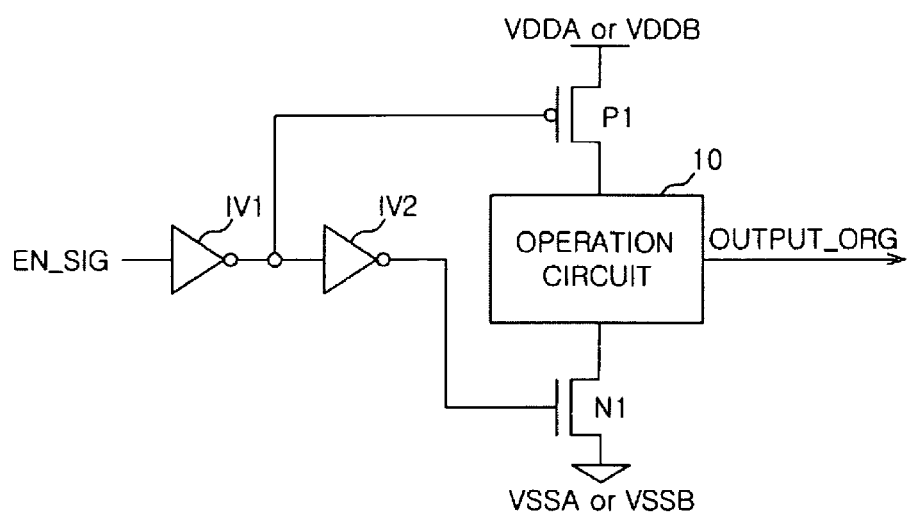
FIG. 1 is a circuit diagram showing a conventional voltage supplying apparatus.
Figure 2:
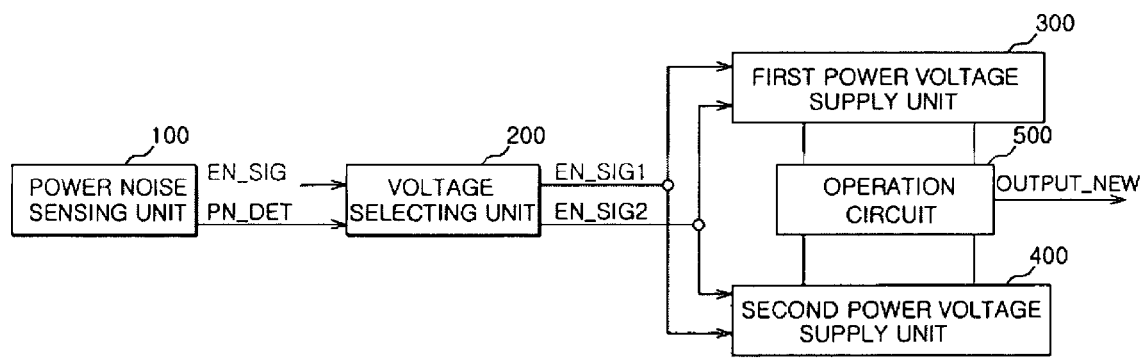
FIG. 2 is a block diagram showing a voltage supply apparatus according to a first embodiment of the present invention.

Referring to FIG. 2, the voltage supply apparatus according to a first embodiment of the present invention includes: a power noise sensing unit 100, a voltage selecting unit 200, a first power voltage supply unit 300, a second power voltage supply unit 400 and an operation circuit 500.

The power noise sensing unit 100 senses the noise from first and second power supplies and outputs a power noise sensing signal PN_DET.

The voltage selecting unit 200 outputs first and second driving signals EN_SIG1 and EN_SIG2 in response to a voltage-supply-enable-signal EN_SIG and the power noise sensing signal PN_DET.

The first power voltage supply unit 300 applies a voltage of the first power supply to the operation circuit 500 in response to the first and second driving signals EN_SIG1 and EN_SIG2.

The second power voltage supply unit 400 applies a voltage of the second power supply to the operation circuit 500 in response to the first and second driving signals EN_SIG1 and EN_SIG2.

The operation circuit 500 receives voltages of the first and second power supplies, executes a predetermined operation, and outputs an output signal OUTPUT_NEW.

The voltage of the first power supply includes a first power voltage VDDA and a first ground voltage VSSA.

The voltage of the second power supply includes a second power voltage VDDB and a second ground voltage VSSB.

The first power voltage VDDA and the second power voltage VDDB may have the same voltage level. Further, the first ground voltage VSSA and the second ground voltage VSSB may have the same voltage level.

The first driving signal EN_SIG1 and the second driving signal EN_SIG2 have inverted levels with respect to each other.

Figure 3:
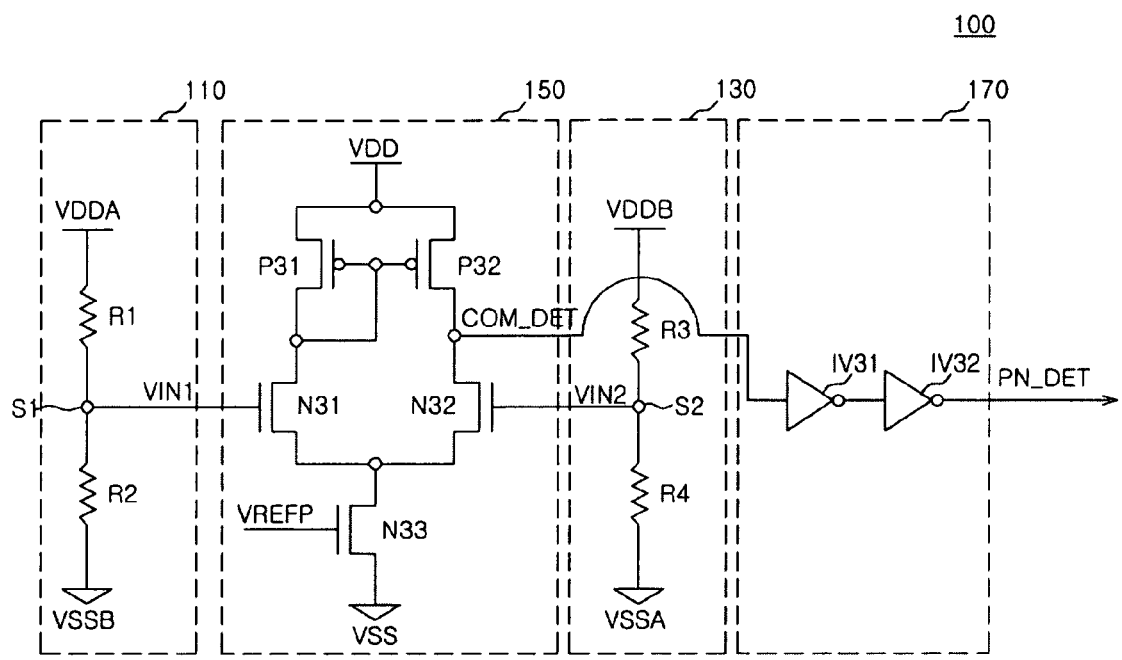
FIG. 3 is a circuit diagram showing the power noise sensing unit shown in FIG. 2.

Referring to FIG. 3, the power noise sensing unit 100 includes: a first voltage distribution unit 110, a second voltage distribution unit 130, a comparison unit 150 and an output unit 170.

The first voltage distribution unit 110 outputs a first voltage distribution signal VIN1 in response to the first power voltage VDDA and the second ground voltage VSSB.

The second voltage distribution unit 130 outputs a second voltage distribution signal VIN2 in response to the second power voltage VDDB and the first ground voltage VSSA.

The comparison unit 150 outputs a comparison signal COM_DET by comparing the first voltage distribution signal VIN1 and the second voltage distribution signal VIN2.

The output unit 170 receives the comparison signal COM_DET and outputs the power noise sensing signal PN_DET.

The first voltage distribution unit 110 includes a first resistor R1 and a second resistor R2. The first and second resistors R1 and R2 may be coupled between the first power voltage VDDA and the second ground voltage VSSB. Here, a first node S1 is a connection node between the first and second resistors R1 and R2. The first voltage distribution signal VIN1 may be output from the first node S1.

The second voltage distribution unit 130 includes a third resistor R3 and a fourth resistor R4. The third and fourth resistors R3 and R4 may be coupled between the second power voltage VDDB and the first ground voltage VSSA. Here, a second node S2 may be a connection node between the third and fourth resistors R3 and R4. The second voltage distribution signal VIN2 may be output from the first node S2

The resistance ratio of the second resistor R2 to the combined resistance of the first resistor R1 and the second resistor R2 may be the same as the ratio of the fourth resistor R4 to the combined resistance of the third resistor R3 and the fourth resistor R4, that is, $$(R2/(R1+R2)=R4/(R3+R4)).$$

The comparison unit 150 may comprise a differential amplifier.

The comparison unit 150 includes: a first PMOS transistor P31, a second PMOS transistor P32, a first NMOS transistor N31, a second NMOS transistor N32 and a third NMOS transistor N33.

The first PMOS transistor P31 has a source terminal that may be coupled to an external power VDD, and gate and drain terminals that may be coupled to each other.

The second PMOS transistor P32 has a source terminal that may be coupled to an external power VDD, and a gate terminal that may be coupled to the gate terminal of the first PMOS transistor P31.

The first NMOS transistor N31 has a gate terminal that receives the first voltage distribution signal VIN1 and a drain terminal that may be coupled to the drain terminal of the first PMOS transistor P31.

The second NMOS transistor N32 has a gate terminal that receives the second voltage distribution signal VIN2, a drain terminal that may be coupled to the drain terminal of the second PMOS transistor P32 at a common node, and a source terminal that may be coupled to the source terminal of the first NMOS transistor N31.

The third NMOS transistor N33 has a gate terminal that receives a reference voltage VREFP, a drain terminal that may be coupled to the source terminal of the second NMOS transistor N32, and a source terminal that may be coupled to a ground power VSS.

In the comparison unit 150, the external power VDD and the ground power VSS are not limited to a predetermined power and can be selected based on the particular implementation.

The reference voltage VREFP may be a constant bias voltage which may be insensitive to process, voltage, or temperature.

In further embodiments of the invention, the comparison unit 150 may be another type of a differential amplifier which responds to the first voltage distribution signal VIN1 and the second voltage distribution signal VIN2. Therefore, the comparison unit 150 is not limited to the above described embodiment.

The output unit 170 includes a first inverter IV31 and a second inverter IV32. The first inverter IV31 inverts the comparison signal COM_DET. The second inverter IV32 inverts a signal COM_DETb output by the first inverter IV31 and outputs the inverted signal as the power noise sensing signal PN_DET.

The output unit 170 shown in FIG. 3 includes two inverters IV31 and IV32. However, the output unit 170 may include two or more inverters.

Figure 4:
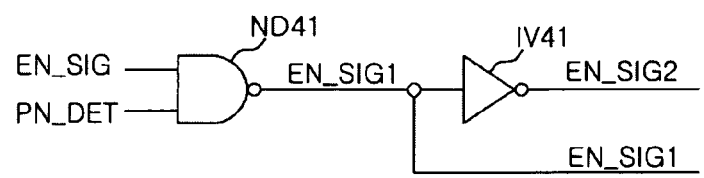
FIG. 4 is a circuit diagram showing the voltage selecting unit shown in FIG. 2.

Referring to FIG. 4, the voltage selecting unit 200 includes a first NAND gate ND41 and a third inverter IV41.

The first NAND gate ND41 receives the voltage-supply-enable-signal EN_SIG and the power noise sensing signal PN_DET and outputs a first driving signal EN_SIG1

The third inverter IV41 inverts the first driving signal EN_SIG1 and outputs the inverted signal as a second driving signal EN_SIG2.

The voltage selecting unit 200 outputs the first driving signal EN_SIG1 and the second driving signal EN_SIG2 that has an inverted level with respect to the first driving signal EN_SIG1 in response to the voltage-supply-enable-signal EN_SIG and the power noise sensing signal PN_DET.

When the voltage-supply-enable-signal EN_SIG input has a high level, any one of the first power voltage supply unit 300 and the second power voltage supply unit 400 can be selectively activated in response to the power noise sensing signal PN_DET. When the voltage-supply-enable-signal EN_SIG input has a low level, the second power voltage supply unit 400 may be activated regardless of the power noise sensing signal PN_DET.

Depending on a particular implementation, the voltage selecting unit 200 may not receive the voltage-supply-enable-signal EN_SIG, not include the first NAND gate ND_41, and include only the third inverter IV41. In the voltage selecting unit 200, the power noise sensing signal PN_DET may be output as the first driving signal EN_SIG1 and the third inverter IV41 may invert the power noise sensing signal PN_DET and output the inverted signal as the second driving signal EN_SIG2.

Embodiments of the present invention will now be described based on the assumption that the voltage-supply-enable-signal EN_SIG is input at a high level.

Figure 5:
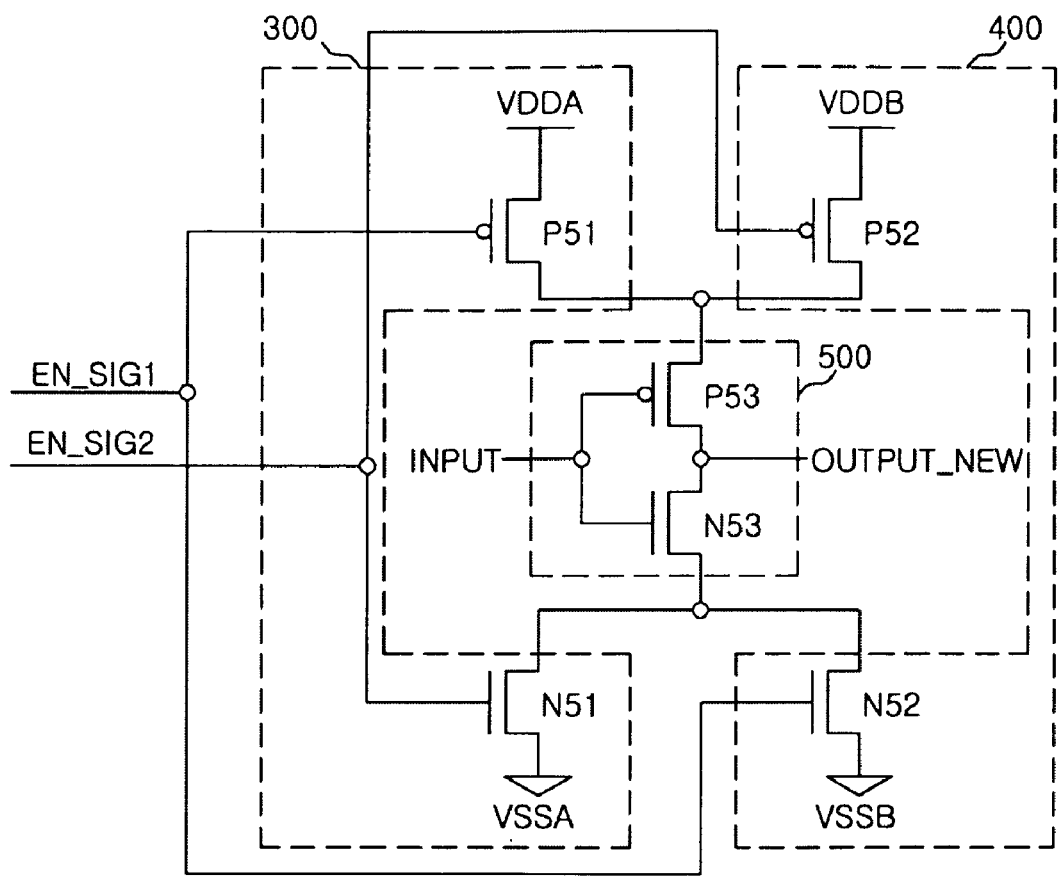
FIG. 5 is a circuit diagram showing an example of first and second power voltage supply units shown in FIG. 2.

Referring to FIG. 5, the first power voltage supply unit 300 includes a third PMOS transistor P51 and a fourth NMOS transistor N51.

The third PMOS transistor P51 has a gate terminal that receives the first driving signal EN_SIG1, a source terminal to which the first power voltage VDDA may be applied, and a drain terminal that may be coupled to the operation circuit 500.

The fourth NMOS transistor N51 has a gate terminal that receives the second driving signal EN_SIG2, a source terminal to which the first ground voltage VSSA may be applied, and a drain terminal that may be coupled to the operation circuit 500.

The second power voltage supply unit 400 includes a fourth PMOS transistor P52 and a fifth NMOS transistor N52.

The fourth PMOS transistor P52 has a gate terminal that receives the second driving signal EN_SIG2, a source terminal to which the second power voltage VDDB may be applied, and a drain terminal that may be coupled to the operation circuit 500;

The fifth NMOS transistor N52 has a gate terminal that receives the first driving signal EN_SIG1, a source terminal to which the second ground voltage VSSB may be applied, and a drain terminal that may be coupled to the operation circuit 500.

The operation circuit 500 includes: a fifth PMOS transistor P53 and a sixth NMOS transistor N53.

The fifth PMOS transistor P53 has a gate terminal that receives an input signal INPUT and a source terminal that may be coupled to the drain terminal of the third PMOS transistor P51 and the drain terminal of the fourth PMOS transistor P52.

The sixth NMOS transistor N53 has a gate terminal that receives the input signal INPUT, a drain terminal that may be coupled to the drain terminal of the fifth PMOS transistor P53, and a source terminal that may be coupled to the drain terminal of the fourth NMOS transistor N51 and the drain terminal of the fifth NMOS transistor N52.

The output signal OUTPUT_NEW may be output from a node where the drain terminal of the fifth PMOS transistor P53 is coupled to the drain terminal of the sixth NMOS transistor N53.

In this embodiment, the operation circuit 500 may be an inverter which includes the fifth PMOS transistor P53 and the sixth NMOS transistor N53. The inverter inverts the input signal INPUT and outputs the inverted signal as the output signal OUTPUT_NEW. The operation circuit 500 may be formed by any type of circuit for performing this function and is not limited to the above described embodiment.

Figure 6:
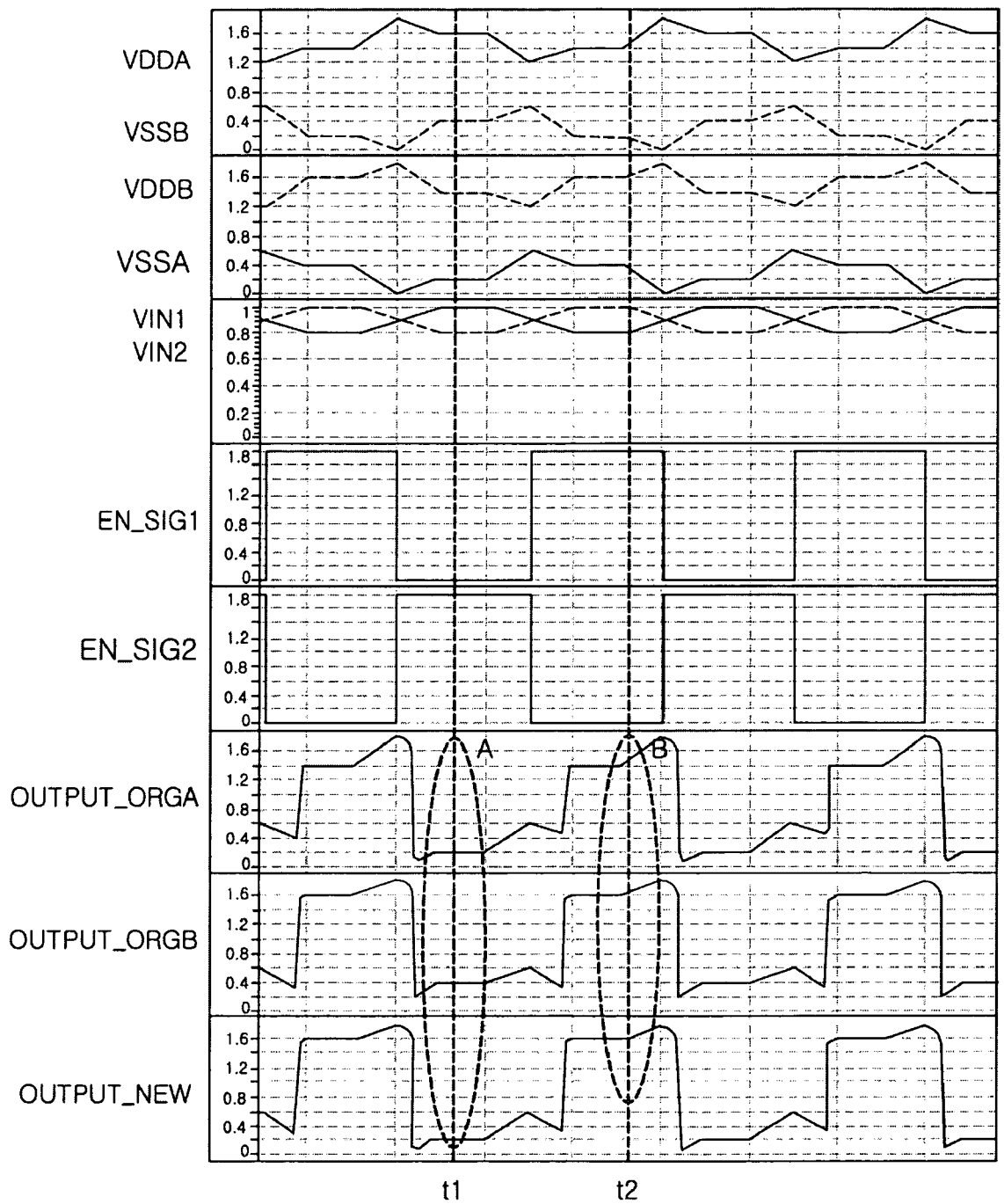
FIG. 6 is a timing view of a simulation of the voltage supply apparatus according to the embodiment of the present invention.

FIG. 6 is a timing view of a simulation of the voltage supply apparatus according to the above-described embodiment of the present invention.

As shown in FIG. 6, at a first time t1, the first power voltage VDDA and the first ground voltage VSSA have less noise than the second power voltage VDDB and the second ground voltage VSSB. At this time, since the first voltage distribution signal VIN1 is at a higher level than the second voltage distribution signal VIN2, the first driving signal EN_SIG1 changes to a low level and the second driving signal EN_SIG2 changes to a high level. Therefore, the first power voltage VDDA and the first ground voltage VSSA having less noise are applied to the operation circuit 500 and the output signal OUTPUT_NEW may be output.

On the other hand, at a second time t2, the first power voltage VDDA and the first ground voltage VSSA have more noise than the second power voltage VDDB and the second ground voltage VSSB. At this time, since the first voltage distribution signal VIN1 is at a lower level than the second voltage distribution signal VIN2, the first driving signal EN_SIG1 changes to a high level and the second driving signal EN_SIG2 changes to a low level. Therefore, the second power voltage VDDB and the second ground voltage VSSB having less noise are applied to the operation circuit 500 and the output signal OUTPUT_NEW may be output.

Further, when the operation circuit 500 receives the second power voltage VDDB and the second ground voltage VSSB and outputs the output signal OUTPUT_NEW, there may be essentially no noise in the first power voltage VDDA, the first ground voltage VSSA, the second power voltage VDDB, and the second ground voltage VSSB. Therefore, even when the level of the first voltage distribution signal VIN1 becomes the same as the level of the second voltage distribution signal VIN2, the operation circuit 500 receives the second power voltage VDDB and the second ground voltage VSSB and outputs the output signal OUTPUT_NEW.

When the operation circuit 500 receives the first power voltage VDDA and the first ground voltage VSSA and outputs the output signal OUTPUT_NEW, there may be essentially no noise in the first power voltage VDDA, the first ground voltage VSSA, the second power voltage VDDB, and the second ground voltage VSSB. Therefore, even when the level of the first voltage distribution signal VIN1 becomes the same as the level of the second voltage distribution signal VIN2, the operation circuit 500 receives the first power voltage VDDA and the first ground voltage VSSA and outputs the output signal OUTPUT_NEW.

In FIG. 6, a first output signal OUTPUT_ORGA may be output from the operation circuit 500 when it receives the first power voltage VDDA and the first ground voltage VSSA. A second output signal OUTPUT_ORGB may be output from the operation circuit 500 when it receives the second power voltage VDDB and the second ground voltage VSSB. The noise of the first power voltage VDDA and the first ground voltage VSSA and noise of the second power voltage VDDB and the second ground voltage VSSB may be sensed. The power supply having less noise may be selectively applied to the operation circuit 500. The output signal OUTPUT_NEW may be output from the operation circuit 500.

That is, as in region A of FIG. 6, when the first ground voltage VSSA has less noise than the second ground voltage VSSB, the first ground voltage VSSA may be applied to the operation circuit 500, and the operation circuit 500 outputs the output signal OUTPUT_NEW. As shown in region B, when the second power voltage VDDB has less noise than the first power voltage VDDA, the second power voltage VDDB may be applied to the operation circuit 500, and the operation circuit 500 outputs the output signal OUTPUT_NEW.

The operation of the voltage supply apparatus according to this embodiment of the present invention will be described below with reference to FIGS. 2 to 6.

In a voltage supply apparatus according to an embodiment of the present invention, the power noise sensing unit 100 senses the power noise of the first and second power supplies, and outputs the power noise sensing signal PN_DET. The voltage selecting unit 200 outputs the first driving signal EN_SIG1 and the second driving signal EN_SIG2 in response to the voltage-supply-enable-signal EN_SIG and the power noise sensing signal PN_DET. Any one of the first power voltage supply unit 300 and the second power voltage supply unit 400 may be activated in response to the first driving signal EN_SIG1 and the second driving signal EN_SIG2. The voltage of the first power supply and the second power supply which has less noise may be applied to the operation circuit 500. Therefore, the operation circuit 500 can stably output the output signal OUTPUT_NEW.

In particular, the power noise sensing unit 100 compares the levels of the first power voltage VDDA and the first ground voltage VSSA, which are the voltages of the first power supply, and the levels of the second power voltage VDDB and the second ground voltage VSSB, which are the voltages of the second power supply and outputs the power noise sensing signal PN_DET.

As shown in FIG. 3, the first voltage distribution unit 110 receives the first power voltage VDDA and the second ground voltage VSSB and outputs the first voltage distribution signal VIN1 having a voltage level divided by the first resistor R1 and the second resistor R2. The second voltage distribution unit 130 receives the second power voltage VDDB and the first ground voltage VSSA, and outputs the second voltage distribution signal VIN2 having a voltage level divided by the third resistor R3 and the fourth resistor R4. The comparison unit 150 compares the level of the first voltage distribution signal VIN1 and the level of the second voltage distribution signal VIN2 and outputs the comparison signal COM_DET.

The level of the first voltage distribution signal VIN1 output from the first voltage distribution unit 110 can be obtained as follows:

$$VIN1=(VDDA+VSSB)*\{R2/(R1+R2)\}.$$

When the noise of the first power voltage VDDA and the first ground voltage VSSA is comparatively larger than noise of the second power voltage VDDB and the second ground voltage VSSB, the level of the first voltage distribution signal VIN1 becomes lower than the level of the first voltage distribution signal VIN1 of when the first and second power voltages VDDA and VDDB and the first and second ground voltages VSSA and VSSB have no noise. On the other hand, when the noise of the first power voltage VDDA and the first ground voltage VSSA is comparatively smaller than the noise of the second power voltage VDDB and the second ground voltage VSSB, the level of the first voltage distribution signal VIN1 becomes higher than the level of the first voltage distribution signal VIN1 of when the first and second power voltages VDDA and VDDB and the first and second ground voltages VSSA and VSSB have no noise.

Further, the level of the second voltage distribution signal VIN2 output from the second voltage distribution unit 130 may be obtained as follows:

$$VIN2=(VDDB+VSSA)*\{R4/(R3+R4)\}.$$

When the noise of the first power voltage VDDA and the first ground voltage VSSA is comparatively larger than noise of the second power voltage VDDB and the second ground voltage VSSB, the level of the second voltage distribution signal VIN2 becomes higher than the level of the second voltage distribution signal VIN2 of when the first and second power voltages VDDA and VDDB and the first and second ground voltages VSSA and VSSB have no noise. On the other hand, when the noise of the first power voltage VDDA and the first ground voltage VSSA is comparatively smaller than the noise of the second power voltage VDDB and the second ground voltage VSSB, the level of the second voltage distribution signal VIN2 becomes lower than the level of the second voltage distribution signal VIN2 of when the first and second power voltages VDDA and VDDB and the first and second ground voltages VSSA and VSSB have no noise.

When the first voltage distribution signal VIN1 is at a lower level than the second voltage distribution signal VIN2, the comparison unit 150 outputs the comparison signal COM_DET at a low level. When the first voltage distribution signal VIN1 is at a higher level than the second voltage distribution signal VIN2, the comparison unit 150 outputs the comparison signal COM_DET at a high level.

The output unit 170 outputs a power noise driving signal PN_DET having a level determined in response to the comparison signal COM_DET.

That is, the power noise driving signal PN_DET may be output at a low level when the first power voltage VDDA and the first ground voltage VSSA have more noise than the second power voltage VDDB and the second ground voltage VSSB. On the other hand, the power noise driving signal PN_DET may be output at a high level when the first power voltage VDDA and the first ground voltage VSSA have less noise than the second power voltage VDDB and the second ground voltage VSSB.

In the voltage selecting unit 200, the first NAND gate ND41 receives the power noise sensing signal PN_DET and voltage-supply-enable-signal EN_SIG which are at a high level and outputs the first driving signal EN_SIG1. The third inverter IV41 inverts the first driving signal EN_SIG1 and outputs the inverted signal as the second driving signal EN_SIG2.

The first driving signal EN_SIG1 may be input to the gate terminal of the third PMOS transistor P51, included in the first power voltage supply unit 300, to control the first power voltage VDDA to be applied to the operation circuit 500. Further, the first driving signal EN_SIG1 may be input to the gate terminal of the fifth NMOS transistor N52, included in the second power voltage supply unit 400, so as to control the second ground voltage VSSB to be applied to the operation circuit 500.

The second driving signal EN_SIG2 may be input to the gate terminal of the fourth NMOS transistor N51, included in the first power voltage supply unit 300, to control the first ground voltage VSSA to be applied to the operation circuit 500. Further, the second driving signal EN_SIG2 may be input to the gate terminal of the fourth PMOS transistor P52, included in the second power voltage supply unit 400, so as to control the second power voltage VDDB to be applied to the operation circuit 500.

When the power noise sensing signal PN_DET is at a low level, the first driving signal EN_SIG1 changes to a high level and the second driving signal EN_SIG2 changes to a low level. The second driving signal EN_SIG2 causes the fourth PMOS transistor P52 to turn on and the first driving signal EN_SIG1 causes the fifth NMOS transistor N52 to turn on. Therefore, the second power voltage supply unit 400 may be activated such that the second power voltage VDDB and the second ground voltage VSSB are applied to the operation circuit 500.

When the power noise sensing signal PN_DET is at a high level, the first driving signal EN_SIG1 changes to a low level and the second driving signal EN_SIG2 changes to a high level. The second driving signal EN_SIG2 causes the fourth NMOS transistor N51 to turn on and the first driving signal EN_SIG1 causes the third PMOS transistor P51 to turn on. Therefore, the first power voltage supply unit 300 may be activated such that the first power voltage VDDA and the first ground voltage VSSA are applied to the operation circuit 500.

Figure 7:
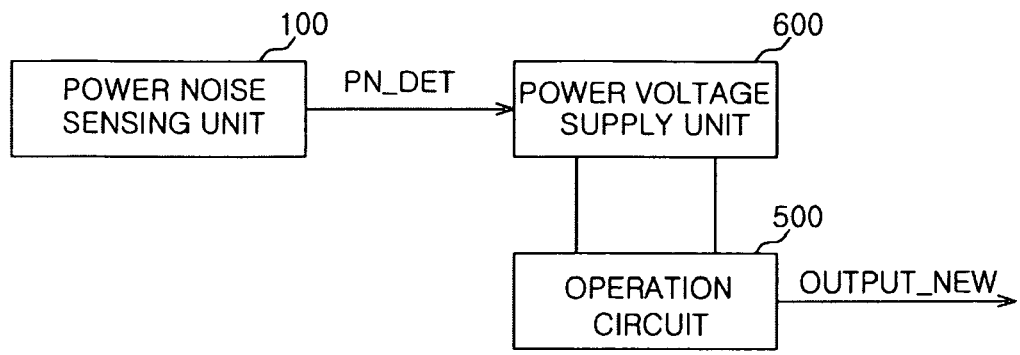
FIG. 7 is a block diagram showing a voltage supply apparatus according to a second embodiment of the present invention.

FIG. 7 is a block diagram showing a voltage supply apparatus according to the second embodiment of the present invention.

The voltage supply apparatus according to the second embodiment of the present invention includes: a power noise sensing unit 100, a power voltage supply unit 600 and an operation circuit 500.

The power noise sensing unit 100 senses the noise of first and second power supplies and outputs a power noise sensing signal PN_DET.

The power voltage supply unit 600 selectively supplies any one of a voltage of a first power supply and a voltage of a second power supply in response to the power noise sensing signal PN_DET.

The operation circuit 500 to which any one of the voltage of the first power supply and the voltage of the second power supply may be applied executes a predetermined operation, and outputs an output signal OUTPUT_NEW.

The voltage of the first power supply includes the first power voltage VDDA and the first ground voltage VSSA.

The voltage of the second power supply includes the second power voltage VDDB and the second ground voltage VSSB.

The first power voltage VDDA may be at the same level as the second power voltage VDDB. The first ground voltage VSSA has the same level as the second ground voltage VSSB.

The power noise sensing unit 100 may be designed as shown in FIG. 3. Since FIG. 3 has been described in the above-mentioned embodiment of the invention, the description will be omitted.

Figure 8:
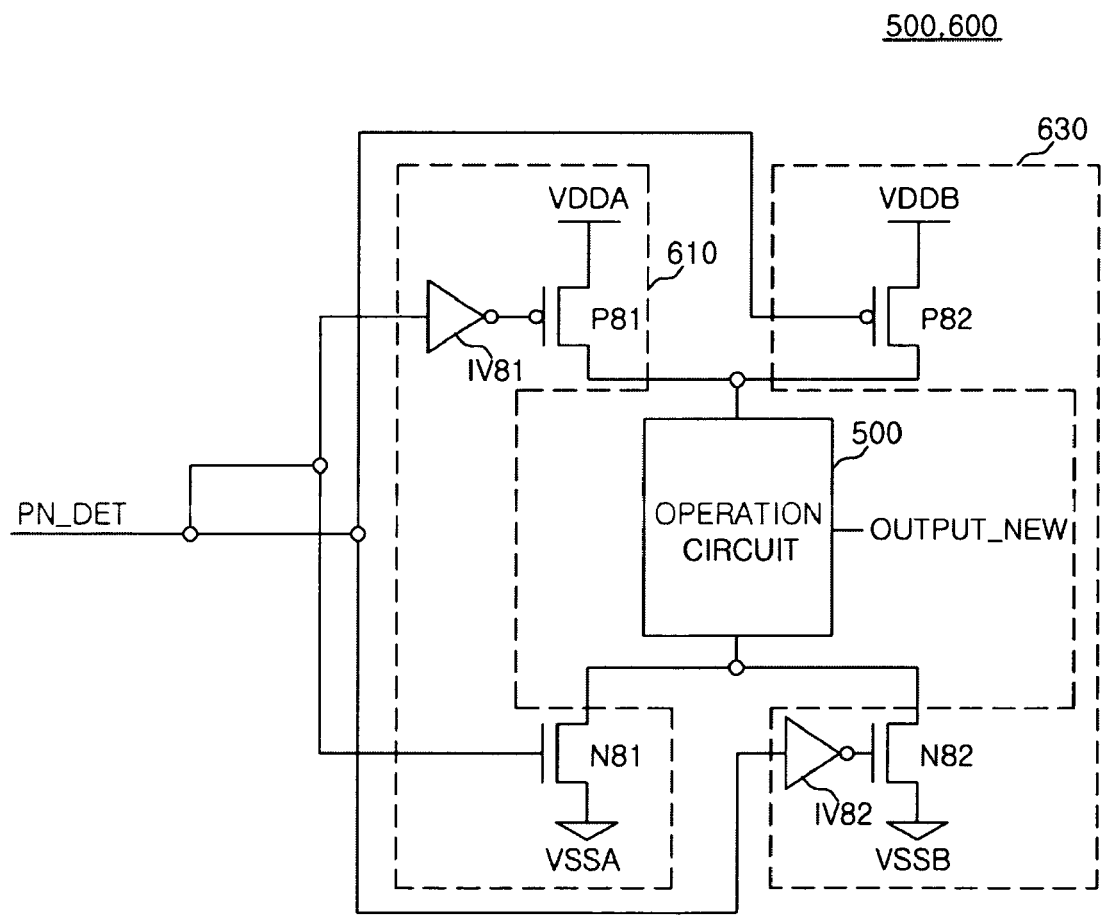
FIG. 8 is a circuit diagram showing the power voltage supply unit shown in FIG. 7.

Referring to FIG. 8, the power voltage supply unit 600 includes a first power voltage supply section 610 and a second power voltage supply section 630.

The first power voltage supply section 610 applies the voltages VDDA and VSSA of the first power supply to the operation circuit 500 in response to a power noise sensing signal PN_DET.

The second power voltage supply section 630 applies the voltages VDDB and VSSB of the second power supply to the operation circuit 500 in response to the power noise sensing signal PN_DET.

The first power voltage supply section 610 includes: a first inverter IV81, a first PMOS transistor P81 and a first NMOS transistor N81.

The first inverter IV81 inverts the power noise sensing signal PN_DET.

The first PMOS transistor P81 has a gate terminal that receives an output signal from the first inverter IV81, a source terminal to which the first power voltage VDDA may be applied, and a drain terminal that may be coupled to the operation circuit 500.

The first NMOS transistor N81 has a gate terminal that receives the output signal PN_DET, a source terminal to which the first ground voltage VSSA may be applied, and a drain terminal that may be coupled to the operation circuit 500.

The second power voltage supply section 630 includes: a second PMOS transistor P82, a second inverter IV82 and a second NMOS transistor N82.

The second PMOS transistor P82 has a gate terminal that receives the power noise sensing signal PN_DET, a source terminal to which the second power voltage VDDB may be applied, and a drain terminal that may be coupled to the operation circuit 500.

The second inverter IV82 inverts the power noise sensing signal PN_DET.

The second NMOS transistor N82 has a gate terminal that receives an output signal from the second inverter IV82, a source terminal to which the second ground voltage VSSB may be applied, and a drain terminal that may be coupled to the operation circuit 500.

The operation of a power voltage supply apparatus according to another embodiment of the present invention will be described below with reference to FIGS. 3, 7 and 8.

In the voltage supply apparatus according to another embodiment of the invention, a power noise sensing unit 100 senses the power noise of a first power supply and a second power supply having the same level, and outputs a power noise sensing signal PN_DET. A power voltage supply unit 600 applies a voltage of the first power supply or the second power supply, whichever has less noise, to the operation circuit 500 in response to the power noise sensing signal PN_DET. Therefore, the operation circuit 500 can stably output an output signal OUTPUT_NEW.

In particular, the power noise sensing unit 100 compares the voltage levels of the first power supply including the first power voltage VDDA and the first ground voltage VSSA, and the voltage levels of the second power supply including the second power voltage VDDB and the second ground voltage VSSB, to output the power noise sensing signal PN_DET.

Referring to the power noise sensing unit 100 shown in FIG. 3, if the noise of the first power voltage VDDA and the first ground voltage VSSA is less than the noise of the second power voltage VDDB and the second ground voltage VSSB, the power noise sensing signal PN_DET may be output at a high level. Meanwhile, if the noise of the first power voltage VDDA and the first ground voltage VSSA is more than the noise of the second power voltage VDDB and the second ground voltage VSSB, the power noise sensing signal PN_DET may be output at a low level.

When the power noise sensing unit 100 outputs the power noise sensing signal PN_DET at a high level, the first PMOS transistor P81 and the first NMOS transistor N81 are turned on in response to the power noise sensing signal PN_DET. Therefore, the first power voltage supply section 610 may be activated such that the first power voltage VDDA and the first ground voltage VSSA are applied to the operation circuit 500.

When the power noise sensing unit 100 outputs the power noise sensing signal PN_DET at a low level, the second PMOS transistor P82 and the second NMOS transistor N82 are turned on in response to the power noise sensing signal PN_DET. Therefore, the second power voltage supply section 630 may be activated such that the second power voltage VDDB and the second ground voltage VSSB are applied to the operation circuit 500.

As described above, according to the voltage supply apparatus and method, the first voltage distribution signal VIN1 obtained by dividing the first power voltage VDDA and the second ground voltage VSSB may be compared with the second voltage distribution signal VIN2 obtained by dividing the second power voltage VDDB and the first ground voltage VSSA so as to sense the noise existing in the first and second power supplies. The first or second power supply having less noise may be applied to the operation circuit 500. Therefore, the operation circuit 500 may be not affected by the power noise and can perform a stable operation, thereby reducing an erroneous operation of a memory circuit.

It will be apparent to those skilled in the art that various modifications and changes may be made without departing from the scope and spirit of the present invention. Therefore, it should be understood that the above embodiments are not limiting, but illustrative in all embodiments. The scope of the present invention is defined by the appended claims rather than by the description preceding them, and therefore all changes and modifications that fall within the metes and bounds of the claims, or equivalents of such metes and bounds are therefore intended to be embraced by the claims.

The voltage supply apparatus and method according to the embodiments of the present invention sense the noise of power supplies and selectively use a power supply having less noise. Therefore, erroneous operations of the circuit due to the power noise can be reduced, thereby improving the performance of the semiconductor memory apparatus.

What is claimed is:

1. An apparatus for supplying voltage comprising:
a power noise sensing unit configured to sense power noise of voltages of a first power supply and a second power supply and output a power noise sensing signal;
a power voltage supply unit configured to selectively supply the voltage of the one of the first power supply and the second power supply that has a lower power noise in response to the power noise sensing signal, wherein a level of the first power supply is same as a level of the second power supply; and
an operation circuit configured to receive the voltage of the first power supply or second power supply and execute a predetermined operation based on the received voltage to produce an output signal.

2. The apparatus of claim 1, wherein the voltage of the first power supply includes a first power voltage and a first ground voltage.

3. The apparatus of claim 2, wherein the voltage of the second power supply includes a second power voltage and a second ground voltage.

4. The apparatus of claim 3, wherein the power noise sensing unit includes:
a first voltage distribution unit configured to receive the first power voltage and the second ground voltage and to output a first voltage distribution signal in response to the first power voltage and the second ground voltage;
a second voltage distribution unit configured to receive the second power voltage and the first ground voltage and to output a second voltage distribution signal in response to the second power voltage and the first ground voltage; and
a comparison unit configured to receive the first voltage distribution signal and the second voltage distribution signal and to output a comparison signal by comparing the first voltage distribution signal and the second voltage distribution signal.

5. The apparatus of claim 4, wherein the power noise sensing unit further includes an output unit configured to receive the comparison signal and output the power noise sensing signal based thereon.

6. The apparatus of claim 5, wherein the first voltage distribution unit includes:
input terminals for the first power voltage and the second ground voltage;
a first resistor coupled between the input terminal for the first power voltage and a first node; and
a second resistor coupled between the input terminal for the second ground voltage and the first node.

7. The apparatus of claim 6, wherein the first voltage distribution unit outputs the first voltage distribution signal from the first node.

8. The apparatus of claim 7, wherein the second voltage distribution unit includes:
input terminals for the second power voltage and the first ground voltage;
a third resistor coupled between the input terminal for the second power voltage and a second node; and
a fourth resistor coupled between the input terminal for the first ground voltage and the second node.

9. The apparatus of claim 8, wherein the second voltage distribution unit outputs the second voltage distribution signal from the second node.

10. The apparatus of claim 9, wherein the first and second power voltages have the same voltage level.

11. The apparatus of claim 10, wherein the first and second ground voltages have the same voltage level.

12. The apparatus of claim 11, wherein a resistance ratio of the second resistor to a combined resistance of the first resistor and the second resistor is the same as a resistance ratio of the fourth resistor to a combined resistance of the third resistor and the fourth resistor.

13. The apparatus of claim 4,
wherein the comparison unit comprises a differential amplifier configured to output the comparison signal in response to the input of first and second voltage distribution signals.

14. The apparatus of claim 1,
wherein the power voltage supply unit includes:
a first power voltage supply section configured to apply the voltage of the first power supply to the operation circuit in response to the power noise sensing signal; and
a second power voltage supply section configured to apply the voltage of the second power supply to the operation circuit in response to the power noise sensing signal.

15. The apparatus of claim 14,
wherein an activation period of the first power voltage supply section does not overlap with an activation period of the second power voltage supply section.

16. The apparatus of claim 15,
wherein the first power voltage supply section includes:
a first inverter configured to receive the power noise sensing signal as input and to produce an output signal;
a first PMOS transistor having a gate terminal configured to receive the output signal from the first inverter, a source terminal configured to receive the first power voltage, and a drain terminal coupled to the operation circuit; and
a first NMOS transistor having a gate terminal configured to receive the power noise sensing signal, a source terminal configured to receive the first ground voltage, and a drain terminal coupled to the operation circuit.

17. The apparatus of claim 16,
wherein the second power voltage supply section includes:
a second PMOS transistor having a gate terminal configured to receive the power noise sensing signal, a source terminal configured to receive the second power voltage, and a drain terminal coupled to the operation circuit;
a second inverter configured to receive the power noise sensing signal as input and produce an output signal; and
a second NMOS transistor having a gate terminal configured to receive the output signal from the second inverter, a source terminal configured to receive the second ground voltage, and a drain terminal coupled to the operation circuit.

18. A method of operating the apparatus for supplying voltage, comprising:
generating a power noise sensing signal by sensing power noise of voltages of first and second power supplies; and
selectively applying the one of the voltage of the first power supply and the voltage of the second power supply that has a lower power noise to an operation circuit in response to the power noise sensing signal, wherein a level of the first power supply is same as a level of the second power supply, wherein the voltage of the first power supply includes a first power voltage and a first ground voltage,
wherein the voltage of the second power supply includes a second power voltage and a second ground voltage, and
wherein the generating of the power noise sensing signal includes:
generating a first voltage distribution signal having a voltage level obtained by dividing the first power voltage and the second ground voltage;
generating a second voltage distribution signal having a voltage level obtained by dividing the second power voltage and the first ground voltage;
comparing the first voltage distribution signal and the second voltage distribution signal to generate a comparison signal; and
generating the power noise sensing signal in response to the comparison signal.

19. The method of claim 18,
wherein the first and second power voltages have the same voltage level.

20. The method of claim 19,
wherein the first and second ground voltages have the same voltage level.

21. The method of claim 20,
wherein the applying of the voltage includes:
applying the first power voltage and the first ground voltage in response to the power noise sensing signal; and
applying the second power voltage and the second ground voltage in response to the power noise sensing signal.

* * * * *